United States Patent
Kirby

(10) Patent No.: US 7,648,900 B2
(45) Date of Patent: Jan. 19, 2010

(54) VIAS HAVING VARYING DIAMETERS AND FILLS FOR USE WITH A SEMICONDUCTOR DEVICE AND METHODS OF FORMING SEMICONDUCTOR DEVICE STRUCTURES INCLUDING SAME

(75) Inventor: Kyle K. Kirby, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/019,920

(22) Filed: Jan. 25, 2008

(65) Prior Publication Data

US 2008/0119043 A1     May 22, 2008

Related U.S. Application Data

(62) Division of application No. 11/044,443, filed on Jan. 26, 2005, now Pat. No. 7,348,671.

(51) Int. Cl.
*H01L 21/44* (2006.01)
*H01L 21/4763* (2006.01)

(52) U.S. Cl. .................. 438/612; 438/637; 438/638; 438/639; 257/762; 257/E21.597

(58) Field of Classification Search .............. 438/612, 438/644, 637–639; 257/753, 762, E21.597
See application file for complete search history.

(56) References Cited

U.S. PATENT DOCUMENTS

| | | | |
|---|---|---|---|
| 4,348,253 | A | 9/1982 | Subbarao et al. |
| 5,292,686 | A | 3/1994 | Riley et al. |
| 6,221,769 | B1 | 4/2001 | Dhong et al. |
| 6,268,660 | B1 | 7/2001 | Dhong et al. |
| 6,410,424 | B1 * | 6/2002 | Tsai et al. .................. 438/637 |
| 6,521,485 | B2 | 2/2003 | Su et al. |
| 6,780,746 | B2 | 8/2004 | Kinsman et al. |
| 6,977,796 | B2 | 12/2005 | Sasaki et al. |
| 7,199,050 | B2 | 4/2007 | Hiatt |
| 7,199,449 | B2 | 4/2007 | Lake |

* cited by examiner

*Primary Examiner*—Hsien-ming Lee

(57) ABSTRACT

A method for forming electrical interconnects having different diameters and filler materials through a semiconductor wafer comprises forming first and second openings through a semiconductor, wherein the first opening has a narrower width (smaller diameter) than the second opening. A first conductive material is formed over the semiconductor wafer to completely fill the narrower opening and only partially fill the wider opening. The first conductive material is optionally removed from the wider opening using an isotropic etch. A second conductive material is subsequently formed over the semiconductor to completely fill the wider opening.

10 Claims, 10 Drawing Sheets

VIAS HAVING VARYING DIAMETERS AND FILLS FOR USE WITH A SEMICONDUCTOR DEVICE AND METHODS OF FORMING SEMICONDUCTOR DEVICE STRUCTURES INCLUDING SAME

CROSS REFERENCE TO RELATED APPLICATION

This application is a divisional to U.S. patent application Ser. No. 11/044,443 filed Jan. 26, 2005, now U.S. Pat. No. 7,348,671.

FIELD OF THE INVENTION

This invention relates to the field of semiconductor manufacture and, more particularly, to a method for forming vias through a semiconductor wafer and the structures resulting from the method.

BACKGROUND OF THE INVENTION

Structures which are increasingly common during the formation of a semiconductor device are conductor-filled vias formed through a semiconductor wafer. The vias provide passageways through the semiconductor wafer, for example from the front (circuit or active) side of the wafer to the back side of the wafer. The conductors may pass power or ground connections, or digital or analog signals from the front of the wafer to the back. These vias may be used with multichip modules to pass connections or signals between stacked semiconductor dice, or to connect a node such as a ground node formed on the front of a single die to the back of the die, which is then connected to a lead frame or other chip carrier.

Power and ground connections typically require a conductor having a larger diameter than is required for transmission of digital or analog signals due to higher current loads needed for power and ground connections than for signals. To conserve space on the surface of a semiconductor die, it is desirable to form digital and analog signal vias at a smaller size than power and ground connection vias. However, this approach requires additional processing, as the first type of via must be formed and filled before forming and filling the second type of via. Additional manufacturing complexity is required to fill the vias with different types of materials, for example copper within signal vias and a tin-lead alloy within power and ground connection vias.

A method which enables the simultaneous formation of different sized vias with different metallization, and structures resulting from the method, would be desirable.

SUMMARY OF THE INVENTION

The present invention comprises a method which, among other advantages, simplifies the formation of conductively filled openings or vias having more than one diameter. In accordance with one embodiment of the invention at least first and second vias are mechanically or chemically etched through a semiconductor wafer, with the first via having a narrower width than the second via. A conformal liner which electrically isolates the material of the wafer from the two vias is formed, then a first metallization is provided to completely fill the narrower first via and to only partially fill the second, wider via. A second metallization is provided to completely fill the remainder of the second, wider via but does not enter the first via, which was previously completely filled with the first metallization. Subsequent processing of the wafer may then continue, as known to those of ordinary skill in the art.

The present invention further comprises a structure in which a first opening is filled with a first conductor and a second opening, which is wider than the first opening, is filled with a second conductor which is different from the first conductor. Various embodiments are contemplated, including embodiments having both the first and second conductor in the second opening, only the second conductor in the second opening, and various layers used for the first and second conductor including first and second conductors which each comprise more than one conductive layer.

Additional advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE ILLUSTRATED EMBODIMENTS

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein. Further, the terms "via" and "opening" are used herein interchangeably.

Figure 1:
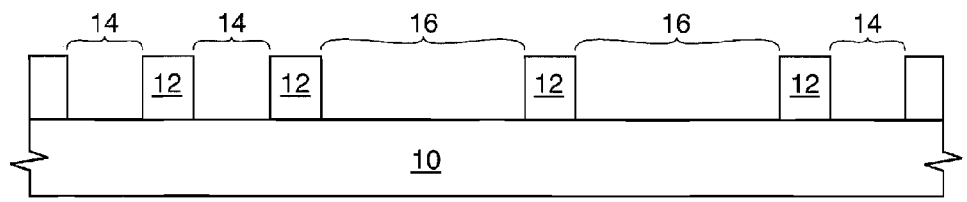
FIGS. 1-4 are cross sections depicting various intermediate in-process structures resulting from a first embodiment of the invention.

A first embodiment of an inventive method for forming vias having two different diameters and fills is depicted in FIGS. 1-4. FIG. 1 depicts a semiconductor wafer 10 and a patterned photoresist layer 12 on a major surface of the semiconductor wafer 10. In this embodiment the photoresist layer comprises first openings 14 having a first diameter and second openings 16 having a second diameter which is larger than the first diameter. The openings will typically have a round, oval, or ovate shape; however, other configurations and physical arrangements of the wide and narrow openings are possible depending on their eventual use and the design of the semiconductor device. The first openings 14 may have a diameter (width) of between about 10 micrometers ($\mu$m) and about 50 $\mu$m, while the second openings 16 may have a diameter (width) of between about 50 $\mu$m and about 100 $\mu$m, such dimensional ranges being exemplary only and not limiting of the present invention.

After forming the FIG. 1 structure, openings are formed in the wafer 10 using any suitable method. For example, the openings may be etched into the wafer using a dry chemical etch comprising the use of sulfur hexafluoride ($SF_6$) and/or tetracarbon hexafluoride ($C_4F_6$), a dry mechanical etch with an inert material such as argon, or with wet etches using potassium hydroxide (KOH) or tetra-methyl ammonium hydroxide (TMAH). The openings may also be formed using laser ablation with a solid state laser (seven watt diode-pumped laser at 355 nanometer wavelength), or with other micromachining methods such as electrical discharge machining (EDM). After etching the openings, the photoresist layer is removed to result in the FIG. 2 structure comprising first openings 20 having a first diameter and second openings 22 having a second diameter which is larger than the first diameter. With this exemplary embodiment, the first openings 20 will define signal connections while the second openings 22 will define power and ground connections. While this embodiment depicts the openings etched completely through the wafer, a partial etch through the wafer followed by a wafer back grind to expose the openings from the back side of the wafer is contemplated as being suitable, and is described below with reference to a later embodiment.

Figure 2:
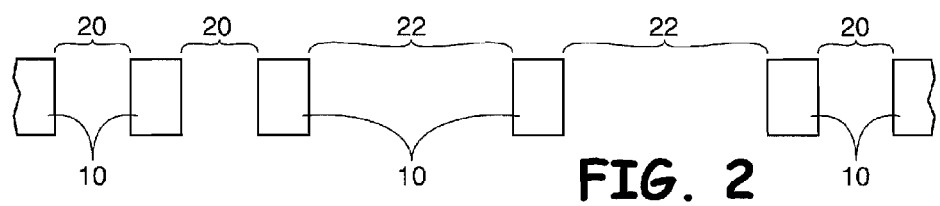

After forming the FIG. 2 structure, a conformal dielectric isolation layer 30 is formed to electrically isolate the semiconductor wafer 10 from subsequently-formed conductive layers. Dielectric layer 30 may comprise a layer formed using tetraethyl orthosilicate (TEOS), a low silane oxide (LSO) formed using chemical vapor deposition (CVD), or a pulsed deposition layer (PDL) oxide. Other contemplated materials for dielectric isolation layer 30 include nitrides formed using atomic layer deposition (ALD), and parylenes such as PDL Parylene HT™. Regardless of the material used for dielectric layer 30, the formation of dielectric layer is preferably performed at a temperature of less than 250° C., and more preferably below about 175° C. to prevent damage to structures which have been previously formed on the wafer. With the openings having the exemplary target diameters described above, isolation layer 30 may have a target thickness of between about 0.25 $\mu$m and about 2.0 $\mu$m or, more preferably, between about 0.5 $\mu$m and about 1.0 $\mu$m.

Figure 3:
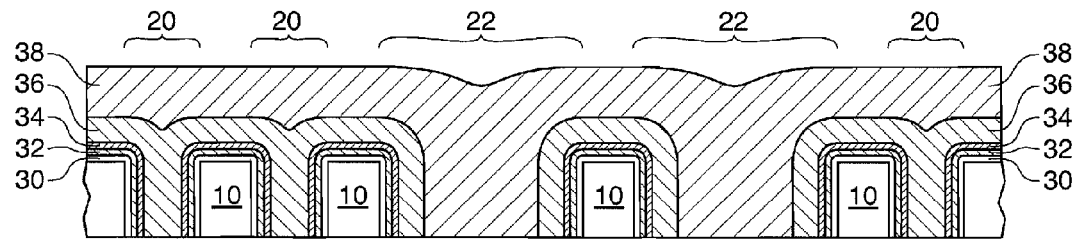

Next, any required adhesion layer (not individually depicted) is formed, then a barrier layer 32 is formed as depicted in FIG. 3. A barrier such as physical vapor deposition (PVD) tungsten or tantalum may be desired to prevent electromigration of metal from a subsequently-formed copper conductor layer to dielectric 30, then to wafer 10. An adhesion layer may be formed if needed to ensure a the barrier does not separate from the dielectric, or to ensure a later-formed metal does not separate from the barrier layer. Each of the barrier layer and the adhesion layer (if formed) may be between about 125 angstroms (Å) and about 225 Å, and more preferably between about 150 Å and about 200 Å thick. Either layer may be formed using chemical vapor deposition (CVD) or atomic layer deposition (ALD).

After forming a barrier layer 32 or an adhesion layer if desired, a conductive seed layer 34 comprising one or more layers of material is formed on the isolation layer. With the diameter of the opening described above, the first conductive seed layer has a target thickness of between about 1,000 Å and about 2,500 Å thick, and more preferably between about 1,500 Å and about 2,000 Å. One preferred seed layer comprises 2,000 Å PVD copper followed by 400 Å electroless copper plating. The plating functions as a seed layer enhancement (SLE) to fill any discontinuities in the PVD film, particularly in the deepest parts of the vias. Next, one or more metal layers 36 are formed to a sufficient thickness to fill the narrow openings, but to leave the wider openings unfilled. Thus metal layer 36 will be of a thickness equivalent to at least half the width of the first openings 20 which remain after forming layers 30-34. As the total thickness of the isolation layer, the barrier layer, and the seed layer for this exemplary embodiment is between about 0.5 $\mu$m and about 2.5 $\mu$m compared to the width of each of the first openings 20 which is between about 10 $\mu$m and about 50 $\mu$m, the fill layer will be formed to have a minimum thickness of between about 4.5 $\mu$m and about 24.5 $\mu$m, depending on the width of the first openings 20 in the wafer. One exemplary metal layer 36 may comprise 1 $\mu$m of copper and 5 $\mu$m of nickel, each deposited using electrochemical deposition (ECD) according to techniques known in the art. The combination of nickel on copper aids in stress reduction in the vias, for example stress placed on the wafer during conductor formation and sheer stress placed on the layers lining the openings in the wafer which may cause them to delaminate.

After forming the first conductive layer seed layer 34 and metal layer 36 to fill the first openings 20 and performing any subsequent desired or required processing, a second conformal conductive layer 38 is formed as depicted in FIG. 3. As the second openings 22 will define relatively high current capacity interconnects, a conductor such as a tin/lead solder or another layer providing low resistance and high reliability may be preferred. Second conductor layer 38 is preferably formed using a wave solder process, or may be formed using other suitable solder processing methods. Other metals which may function sufficiently in this exemplary embodiment include silver, gold, cobalt, nickel, copper, etc. Second conductive layer 38 is formed to a sufficient thickness to result in the complete filling of the second openings 22. With this exemplary embodiment, the second conductive layer is formed to a thickness of between about 20 $\mu$m and about 40 $\mu$m. FIG. 3 depicts a structure with both first conductive layer 36 and second conductive layer 38 within the second openings 22; however, other layers may be present within either of the openings (for example adhesion layers or enhancement layers to improve electrical conduction).

Figure 4:
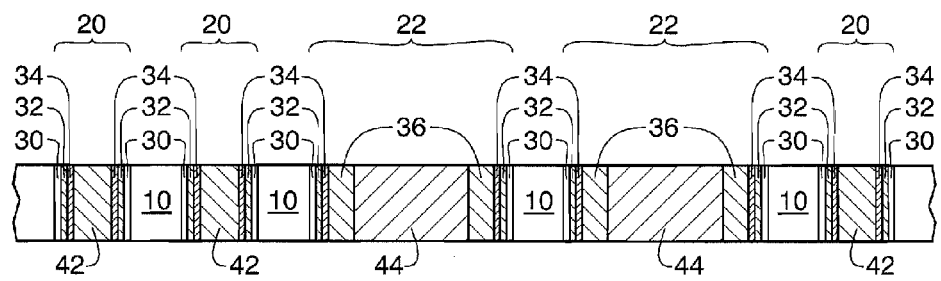

After forming the FIG. 3 structure the layers overlying the horizontal surface of the wafer may be removed, for example using an abrasive technique such as mechanical planarization or chemical-mechanical planarization (CMP) in accordance with means known in the art, to result in the structure of FIG. 4. Any subsequent desired or required wafer processing is then continued according to means known in the art to result in a functional semiconductor device, and includes the connection of signals, power, or ground to the conductors, for example low current connections to the narrower conductors 42 and higher current connections to the wider conductors 44.

Figure 5:
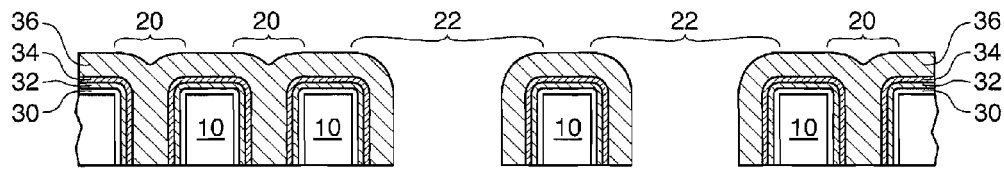
FIG. 5-8 are cross sections depicting various intermediate in-process structures resulting from a second embodiment of the invention.
Figure 6:
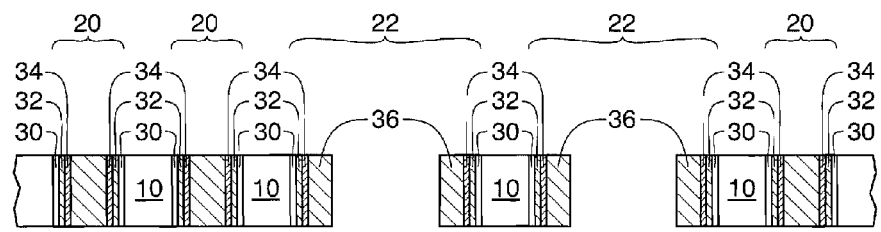
Figure 7:
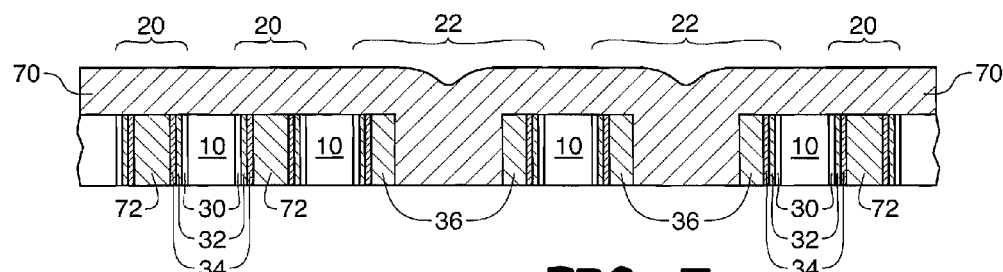
Figure 8:
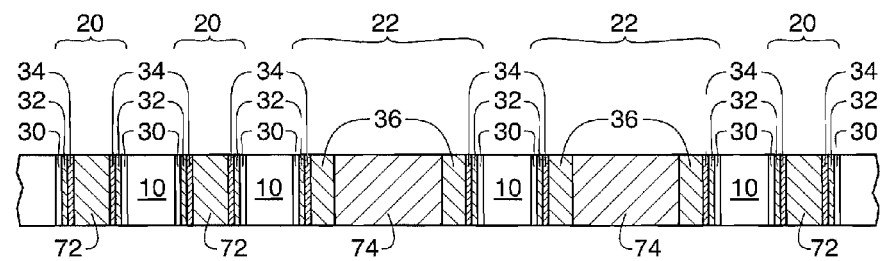
Figure 9:
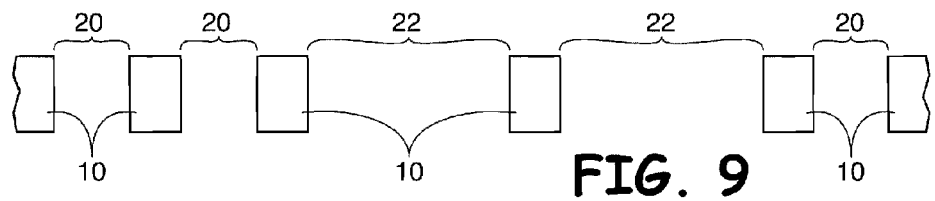
FIGS. 9-13 are cross sections depicting an intermediate in-process structure which results from a third embodiment of the invention.

Another embodiment is depicted by FIGS. 5-8. The structure of FIG. 5 is formed according to the description above, stopping just prior to the step of forming metal layer 38 of FIG. 3. The FIG. 5 structure is planarized, for example using an abrasive technique such as CMP. This may require the formation of a protective layer such as oxide or photoresist within wider, unfilled openings 22 prior to planarization, and the protective layer may be removed after planarization. The structure of FIG. 5 is planarized and any protective material within openings 22 is removed to result in the FIG. 6 structure. A second metal layer 70 is formed as depicted in FIG. 7, for example in a similar manner as that described for layer 38 above. Layer 70 may also be formed using a damascene process (i.e. a blanket deposition and subsequent CMP or other planarization) to result in the narrow 72 and wide 74 conductive lines or plugs having a selected pattern which depends on the intended use of the device and conductors.

Another embodiment is depicted by FIGS. 9-13 and results in the removal of layer 36 of FIG. 3 from the second openings 22, while leaving layer 36 within the first openings 20. In this embodiment, first 20 and second 22 openings are etched into a semiconductor wafer 10 to result in the semiconductor wafer substrate assembly of FIG. 9. Dielectric isolation 30, barrier layer 32, seed layer 34, and first conductive layer 36 are then formed in accordance with the embodiment of FIGS. 1-4 to result in the structure of FIG. 10. At this point the first conductive layer 36 is formed to bridge the first openings 20, and is formed within, but does not bridge, the second openings 22.

Figure 10:
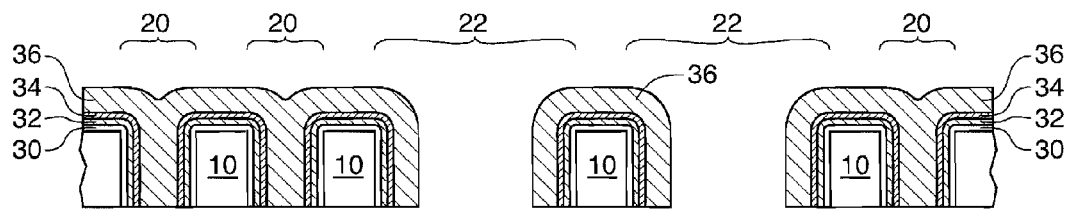
Figure 11:
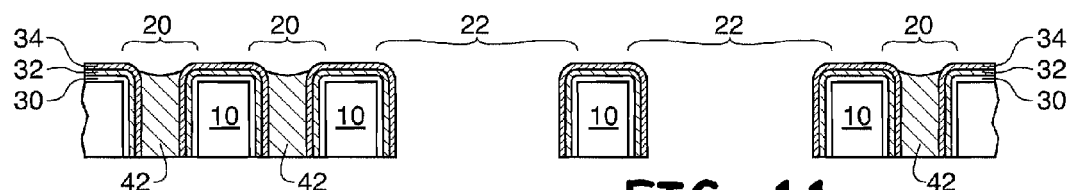

The FIG. 10 structure is then exposed from the active surface to an isotropic etch of layer 36 to result in the FIG. 11 structure. A wet etch such as exposure to an acid comprising a dilute mixture of nitric acid ($HNO_3$), hydrofluoric acid (HF), and acetic acid ($CH_3COOH$, HAc) would be sufficient. Because layer 36 fills the first openings 20 and deposits on the horizontal surface of the wafer over the first openings 20, an etchant will remove layer 36 from within the second openings 22 and from the horizontal surface of the wafer substrate assembly 10, but will leave the conductor within the first openings 20 (unless an over etch is performed, which is to be avoided in this embodiment).

Figure 12:
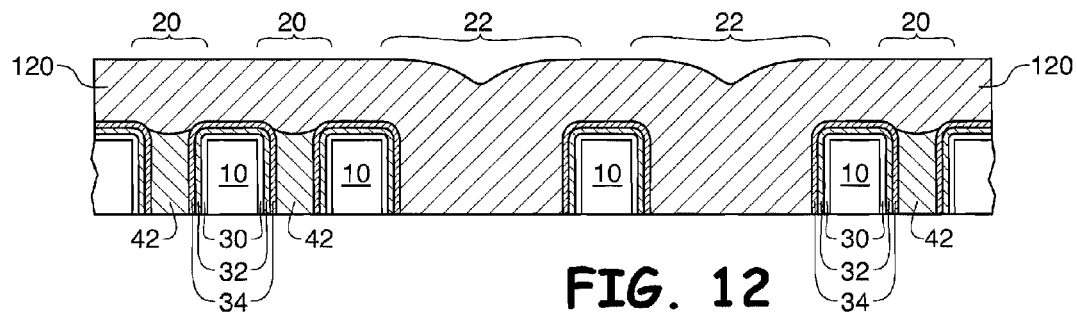
Figure 13:
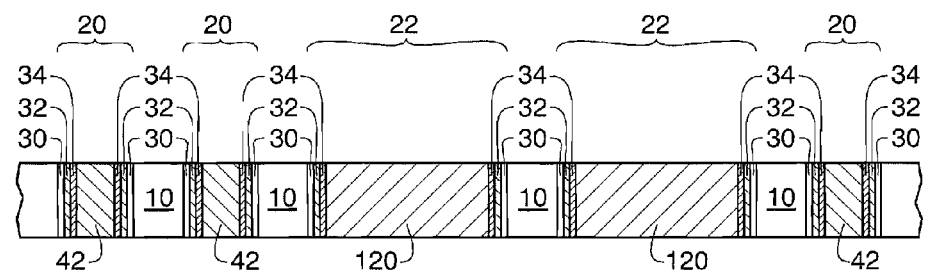

After forming the FIG. 11 structure, a second conductive layer 120 is formed, for example using techniques described above for layer 38, to result in the structure of FIG. 12. Finally, a vertical anisotropic etch, a CMP, or a planarization and an isotropic etch is performed to result in the structure of FIG. 13. This embodiment is useful if the material of layer 36 would result in a conductor within the second openings 22 which is less desirable than having the second openings 22 substantially completely filled with the material of layer 120. For example, if the material of layer 36 has a lower melting temperature, higher resistance, or breaks down more readily under current which will be applied to the conductor in the wider openings than the material of layer 120, this embodiment enables removal of the material of layer 36 to result in a more complete fill of second openings 22 with the material of layer 120.

Figure 14:
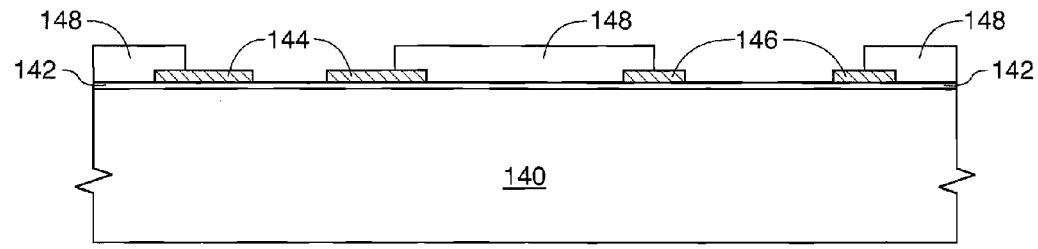
FIGS. 14-25 are cross sections depicting an intermediate in-process structure which results from another embodiment of the invention

Another embodiment of the invention is depicted in FIGS. 14-25. FIG. 14 depicts a semiconductor wafer substrate assembly comprising a semiconductor wafer 140, a dielectric passivation layer 142, first 144 and second 146 bond pads each having an opening etched therethrough, and an overlying dielectric layer 148 which has been patterned to expose the bond pads 144, 146. As depicted, the opening in the first bond pad 144 is narrower (i.e. a smaller diameter for round openings) than the opening in the second bond pad 146. In this embodiment the bond pads are about 100 µm square, the opening in the first bond pad has a diameter of between about 10 µm and 50 µm, and the opening in the second bond pad has a diameter between of about 50 µm and 75 µm, with the opening in the first bond pad 144 having a smaller diameter than the opening in the second bond pad 146. This structure can be manufactured by one of ordinary skill in the art from the description herein.

Figure 15:
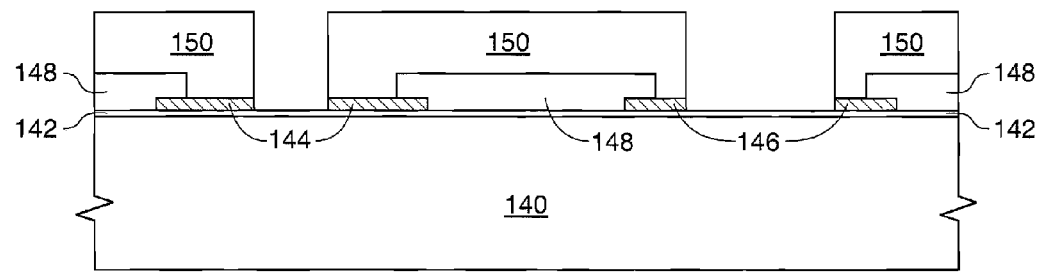
Figure 16:
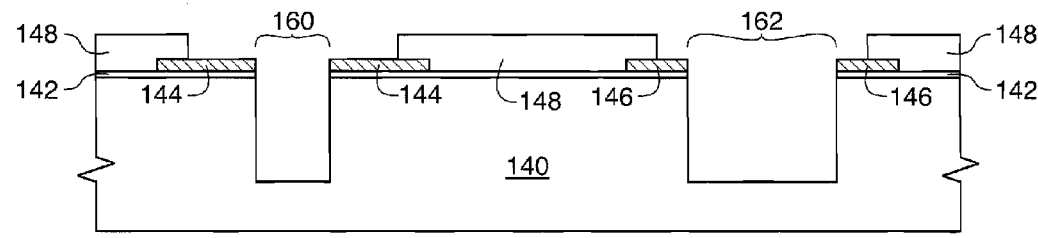

A patterned photoresist mask 150 is formed over the FIG. 14 structure as depicted in FIG. 15. Mask 150 aligns with the edges of the openings in the first 144 and second 146 bond pads. Subsequently, an etch is performed to remove the exposed dielectric passivation 142 and semiconductor wafer 140 as depicted in FIG. 16 to form a first opening 160 and a second opening 162 in the wafer 140, with the second opening 162 being wider than the first opening 160. The mask 150 is then removed to result in the structure of FIG. 16.

Figure 17:
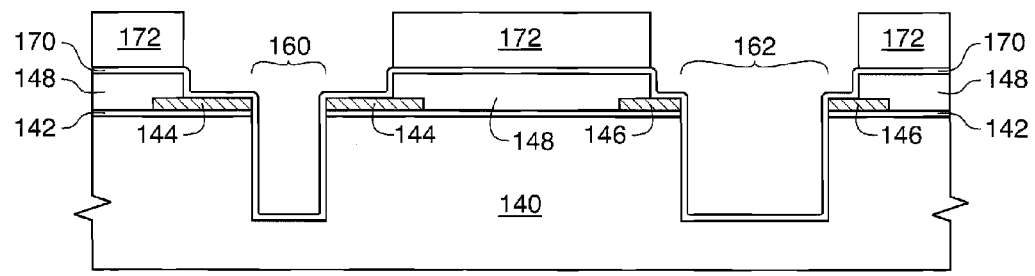
Figure 18:
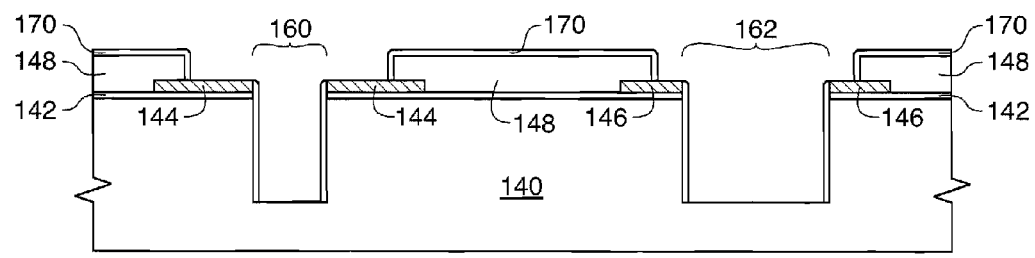

A dielectric layer 170 such as a PDL oxide layer between about 2,000 Å and about 12,000 Å, preferably about 10,000 Å, is formed over exposed surfaces, then a patterned photoresist mask 172 is formed to reflect the pattern of dielectric layer 148 as depicted in FIG. 17. Mask 172 protects portions of dielectric layer 170 which would be otherwise exposed and functions to passivate the top side surface of the die. A vertical anisotropic spacer etch is performed on the dielectric layer 170 to form dielectric spacers 180 as depicted in FIG. 18 along the vertically-oriented sidewalls of the openings which will electrically isolate subsequently-formed conductor from the wafer. Next, the photoresist layer 172 is removed to result in the FIG. 18 structure. The spacer etch may comprise the use of carbon tetrafluoride ($CF_4$), chlorine ($Cl_2$), boron trichloride ($BCl_3$), and argon in a chamber having an atmospheric pressure of about 15 millitorr with about 10 torr of backside pressure. During the etch the temperature of the chamber walls is maintained at about 80° C. with about a 30° C. cathode. Bias power is maintained at about 250 watts, with about 1,200 watts of source power. For a PDL oxide used for dielectric layer 170 as described above, the etch is performed for about 260 seconds. This etch may be optimized by one of ordinary skill in the art.

Figure 19:
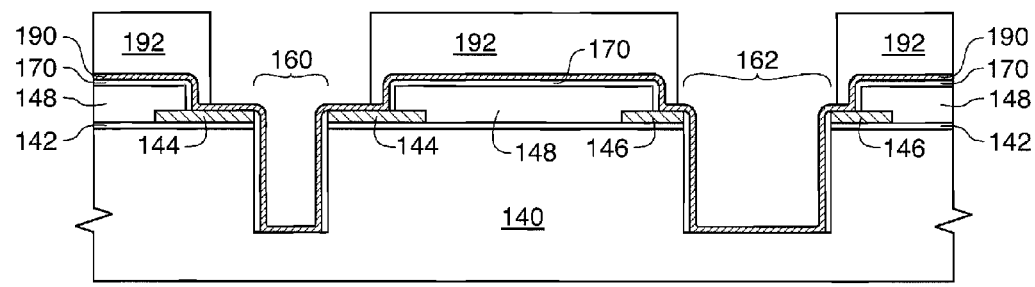

Next, a seed layer 190 is deposited over the surface of the FIG. 18 structure as depicted in FIG. 19. The seed layer may comprise 150 Å of tantalum, 2,000 Å of PVD copper, and 400 Å of ECD copper, with the ECD copper functioning as a seed layer enhancement. Mask layer 192 is then formed to cover oxide layer 148 and the portions of dielectric layer 170 and seed layer 190 which cover oxide 148 as depicted in FIG. 19.

Figure 20:
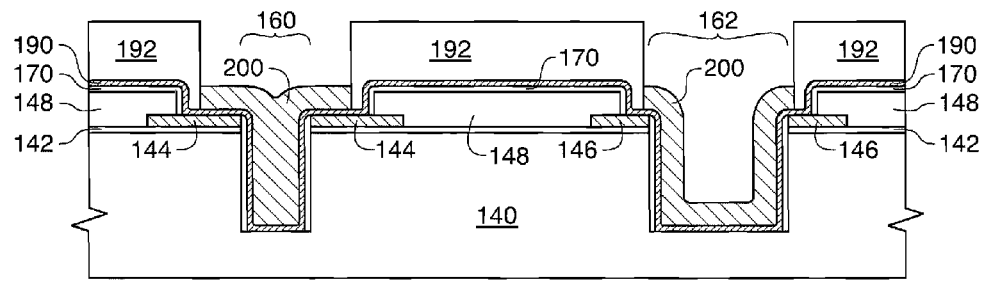
Figure 21:
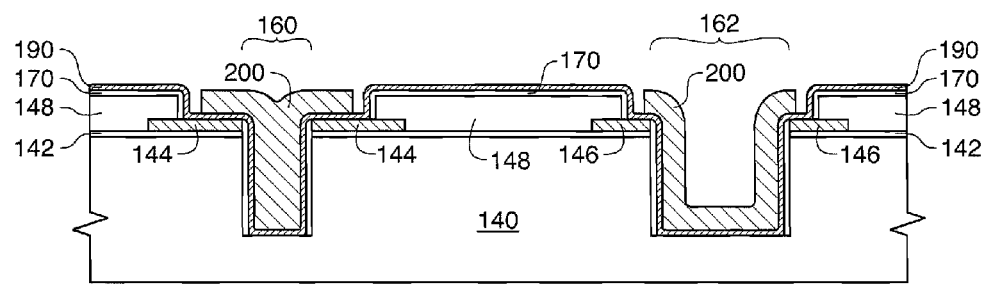

After forming the FIG. 19 structure, a metallization process is performed which results in a conductive layer forming on exposed portions of seed layer 190. This results in the metal layer 200 of FIG. 20. One preferred metal layer 200 comprises the formation of 1 µm of copper using an ECD process, and 5 µm of nickel using an ECD process. During this process the metal bridges the first opening 160, but forms conformally within the second opening 162 as depicted in FIG. 20. To bridge the opening, the metal layer must be formed to have a target thickness of at least half the width of the first opening 160 which remains after forming layers 170 and 190. Subsequently, the photoresist mask 192 is removed to result in the FIG. 21 structure.

Figure 22:
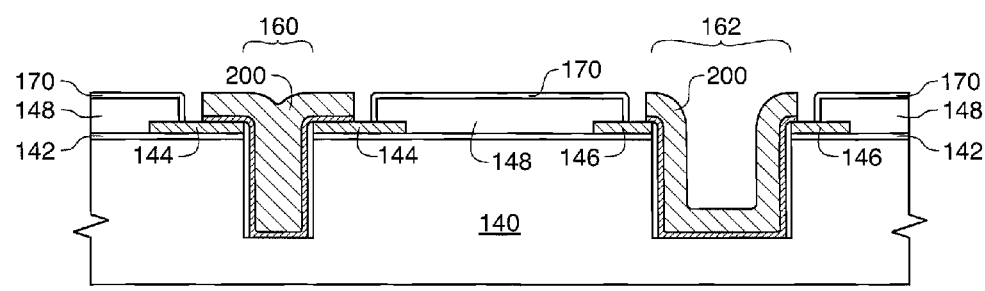

A wet strip of the exposed seed layer is performed, for example using a mixture of hydrofluoric acid, hydrogen peroxide, and propylene glycol to result in the FIG. 22 structure.

Figure 23:
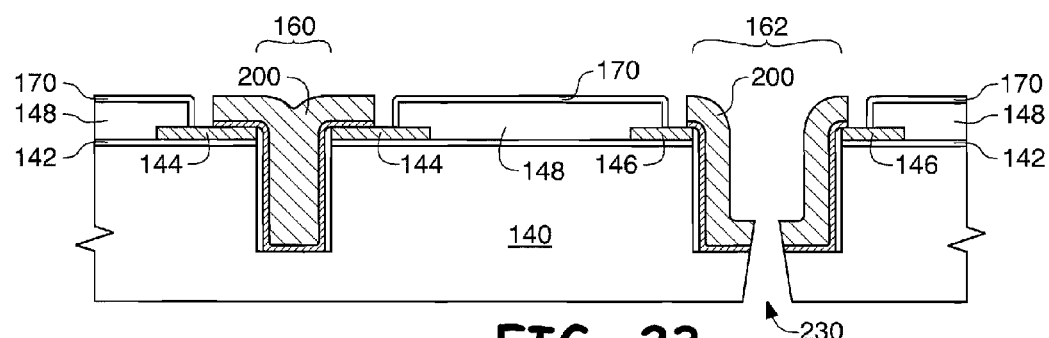
Figure 24:
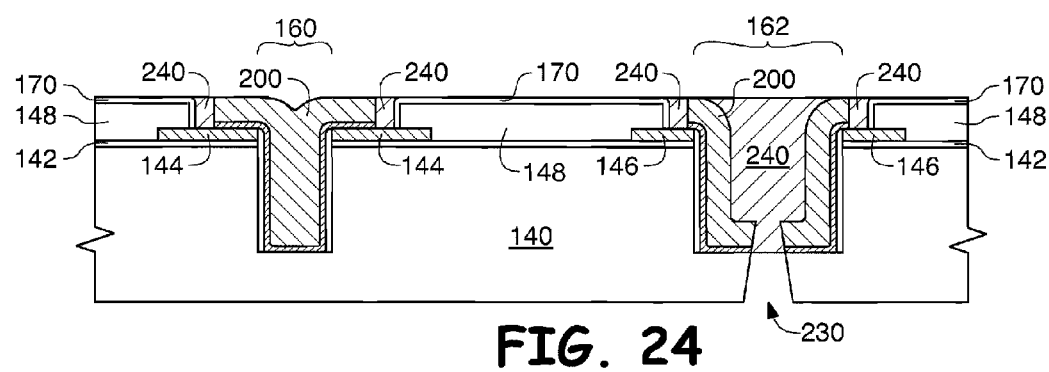

A vent 230 is then formed from the back side of the wafer to the bottom of the second opening 162 as depicted in FIG. 23. The vent is preferably formed using a laser, but the back of the wafer may also be masked and etched using either a dry or a wet etch. The wafer of FIG. 23 is then processed with the back side of the wafer facing up through a wave solder process to form metal, in this embodiment a tin/lead solder, within the second opening 162. The vent in the back of the wafer allows air to escape such that the solder 240 will fill the second opening 162 as depicted in FIG. 24. While the solder is also depicted in smaller voids formed from removal of mask 190 and exposed portions of layer 192, this layer may not form within these smaller voids. If not filled during this process, they will be filled during a subsequent passivation. Further, the solder 240 will adhere to the top of metal 200 which fills the first opening 160 to form a meniscus which may facilitate improved electrical connection during subsequent processing. Other metal layers may also be used to fill the second openings 162 instead of the solder process.

Figure 25:
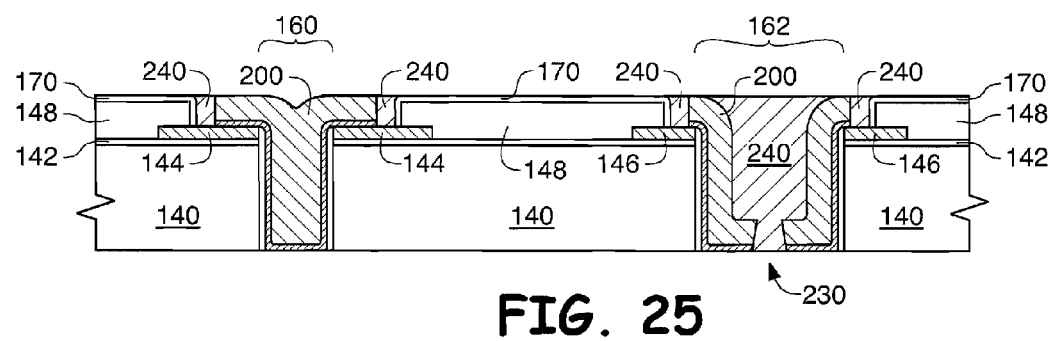

After filling the second opening 162 with metal 240, the wafer is back ground to erode the wafer surface to expose metal 200 and metal 240 from the back side of the wafer as depicted in FIG. 25. This facilitates passing a signal from one side of the wafer to the other through metal 200 and metal 240 within the first 160 and second 162 openings. The first opening 160 in this embodiment is filled with a low resistance conductor, while the second opening 162 is filled with a more reliable conductor, for example one which can withstand higher current. One use of the present process allows for the passage of a digital signal through the metal 200 in the first opening 160, and allows power to be passed through the metal 240 in the second opening 162. Other uses of the present embodiment may also be possible.

Figure 26:
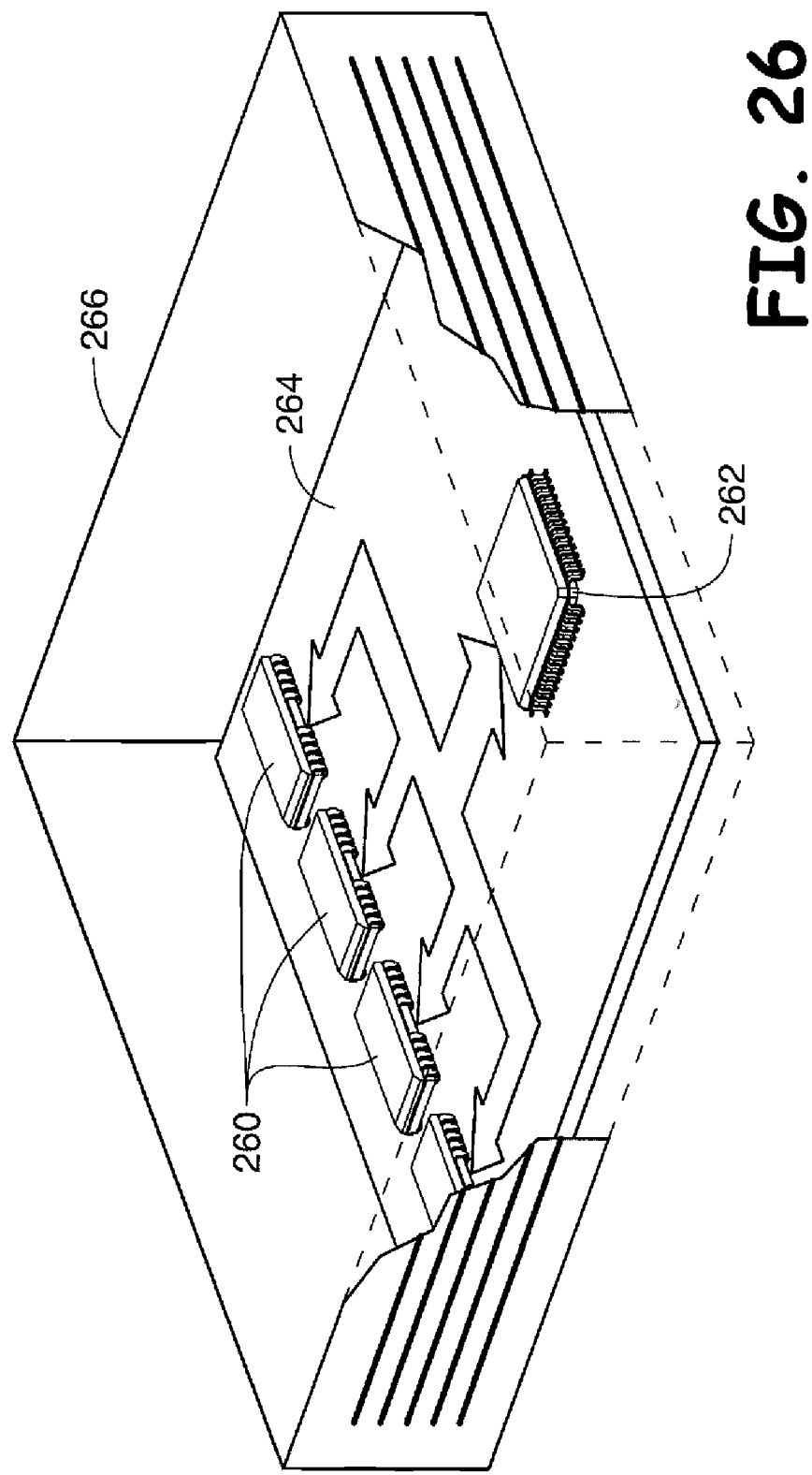
FIG. 26 is an isometric depiction of various components which may be manufactured using devices formed with an embodiment of the present invention.

As depicted in FIG. 26, a semiconductor device 260 formed in accordance with the invention may be attached along with other devices such as a microprocessor 262 to a printed circuit board 264, for example to a computer motherboard or as a part of a memory module used in a personal computer, a minicomputer, or a mainframe 266. FIG. 26 may also represent use of device 260 in other electronic devices comprising a housing 266, for example devices comprising a microprocessor 262, related to telecommunications, the automobile industry, semiconductor test and manufacturing equipment, consumer electronics, or virtually any piece of consumer or industrial electronic equipment.

Figure 27:
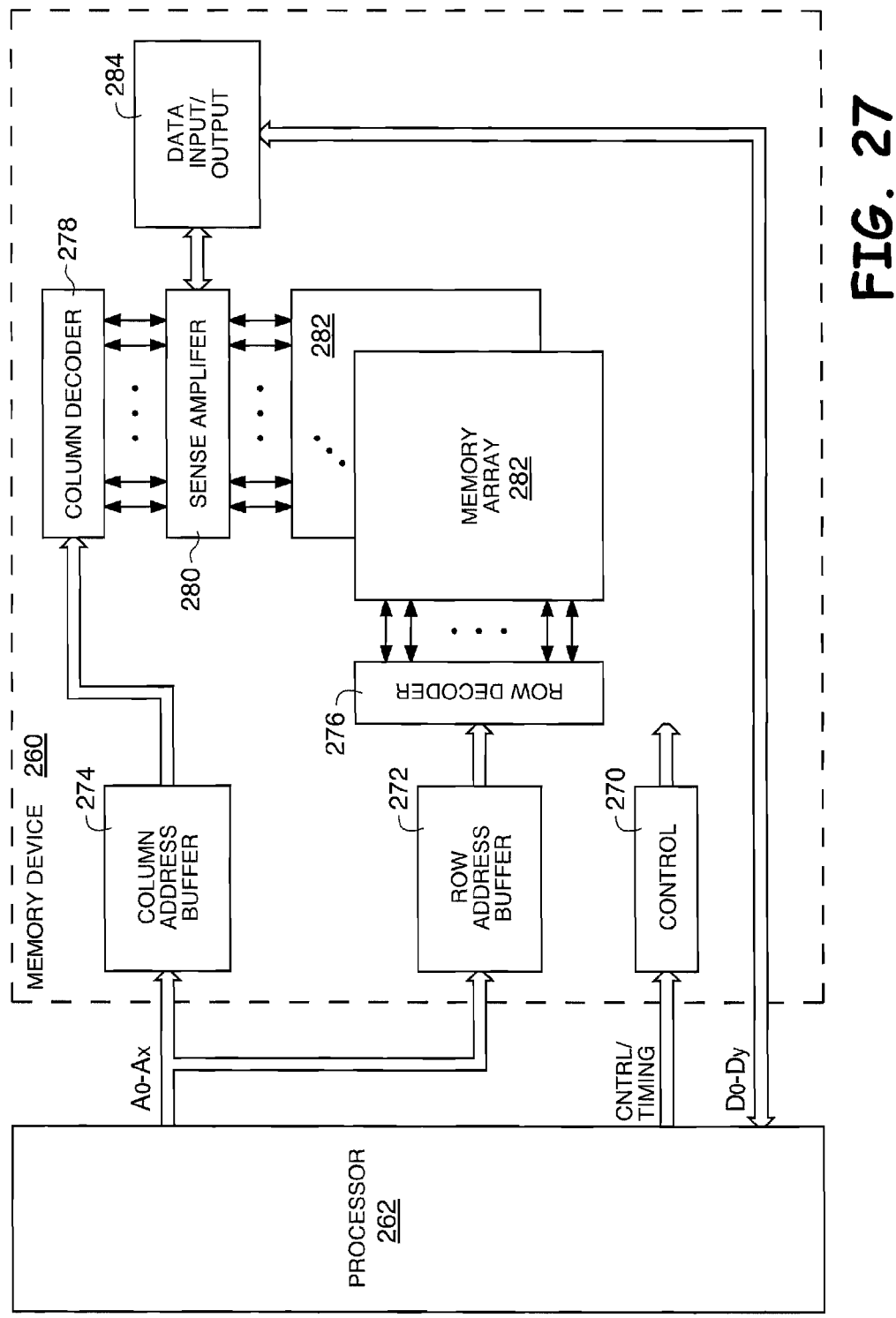
FIG. 27 is a block diagram of an exemplary use of the invention to form part of a memory device having a storage transistor array.

The process and structure described herein can be used to manufacture a number of different structures which comprise a structure formed using a photolithographic process. FIG. 27, for example, is a simplified block diagram of a memory device such as a dynamic random access memory having digital and analog connections, power/ground connections, and other features which may be formed using an embodiment of the present invention. The general operation of such a device is known to one skilled in the art. FIG. 27 depicts a processor 262 coupled to a memory device 260, and further depicts the following basic sections of a memory integrated circuit: control circuitry 270; row 272 and column 274 address buffers; row 276 and column 278 decoders; sense amplifiers 280; memory array 282; and data input/output 284.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the openings in the wafer may be etched only partially into the wafer, then completed by removal of wafer material from the back of the wafer either before or after forming the conductors within the openings. It is therefore contemplated that the appended claims will cover any such modifications or embodiments as fall within the true scope of the invention.

What is claimed is:

1. A method of creating a semiconductor device on a semiconductor wafer, the method comprising:
    creating at least one first opening and at least one second opening therein, the at least one first opening having a width that is narrower than a width of the at least one second opening;
    forming a dielectric portion within the at least one first opening and within the at least one second opening;
    forming a first conductive portion over the semiconductor wafer, the first conductive portion partially filling the at least one second opening and completely filling the at least one first opening;
    forming, prior to forming the first conductive portion, a barrier portion on the dielectric portion;
    subsequent to forming the first conductive layer, forming a second conductive layer over the semiconductor wafer and within the at least one second opening;
    removing the first and second conductive portions from over a major surface of the semiconductor wafer through which the at least one first opening and the at least one second opening are exposed while leaving the first conductive portion within the at least one first opening to form at least one first interconnect and leaving the at least one second conductive portion within the at least one second opening to form at least one second interconnect;
    electrically connecting the at least one first interconnect with one of a digital and an analog signal path; and
    electrically connecting the at least one second interconnect with one of a power and a ground path.

2. A method for use in fabrication of a semiconductor device, the method comprising:
    etching a major surface of a semiconductor wafer to form at least one first opening and at least one second opening at least partially therethrough, wherein the at least one first opening has a narrower width than the at least one second opening;
    forming a substantially conformal portion comprising a first conductor, the first conductor forming simultaneously within the at least one first opening and within the at least one second opening in the semiconductor wafer and substantially fills the at least one first opening and only partially fills the at least one second opening; and
    forming a second conductor within the at least one second opening by filling the partially filled at least one second opening with a solder material.

3. The method of claim 2 further comprising, prior to forming the substantially conformal portion comprising the first conductor:
    forming a conformal dielectric portion over the semiconductor wafer and within the at least one first opening and the at least one second opening in the semiconductor wafer;
    etching the conformal dielectric portion to form dielectric spacers along vertically-oriented sidewalls of the at least one first opening and the at least one second opening to electrically isolate the first conductor and second conductor within the at least one first opening and the at least one second opening from the semiconductor wafer.

4. A method for use in fabrication of a semiconductor device, the method comprising:

etching a major surface of a semiconductor wafer to form at least one first opening and at least one second opening at least partially therethrough, wherein the at least one first opening has a narrower width than the at least one second opening;

forming a substantially conformal portion comprising a first conductor, the first conductor forming simultaneously within the at least one first opening and within the at least one second opening in the semiconductor wafer and substantially fills the at least one first opening and only partially fills the at least one second opening;

forming a second conductor which is different from the first conductor within the at least one second opening;

subsequent to forming the first conductor and prior to forming the second conductor, removing a portion of the semiconductor wafer from a back side of the semiconductor wafer to provide a vent opening into the at least one second opening which extends from the back side of the wafer to the at least one second opening; and placing the semiconductor wafer into a solder wave comprising the second conductor to fill the second opening with the second conductor from a mouth of the at least one second opening.

5. A method for use in fabrication of a semiconductor device, the method comprising:

etching a major surface of a semiconductor wafer to form at least one first opening and at least one second opening at least partially therethrough, wherein the at least one first opening has a narrower width than the at least one second opening, and wherein the at least one first opening and the at least one second opening are etched through openings in first and second bond pads located on the major surface of the semiconductor wafer;

forming a substantially conformal portion comprising a first conductor, the first conductor forming simultaneously within the at least one first opening and within the at least one second opening in the semiconductor wafer and substantially fills the at least one first opening and only partially fills the at least one second opening;

etching the first conductor to remove the first conductor from within the at least one second opening and leaving the first conductor within the at least one first opening; and forming a second conductor which is different from the first conductor within the at least one second opening.

6. A method for use in fabrication of a semiconductor device, the method comprising:

etching a major surface of a semiconductor wafer to form at least one first opening and at least one second opening at least partially therethrough, wherein the at least one first opening has a narrower width than the at least one second opening, and wherein the at least one first opening and the at least one second opening are completely etched through the semiconductor wafer;

forming a substantially conformal portion comprising a first conductor, the first conductor forming simultaneously within the at least one first opening and within the at least one second opening in the semiconductor wafer and substantially fills the at least one first opening and only partially fills the at least one second opening; and forming a second conductor which is different from the first conductor within the at least one second opening.

7. A method for use in fabrication of a semiconductor device, the method comprising:

etching a major surface of a semiconductor wafer to form at least one first opening and at least one second opening at least partially therethrough, wherein the at least one first opening has a narrower width than the at least one second opening;

forming a conformal dielectric portion within the at least one first opening and the at least one second opening in the semiconductor wafer;

etching the conformal dielectric portion to form spacers along sidewalls of the at least one first opening and the at least one second opening;

forming an electromigration barrier comprising a material selected from the group consisting of tungsten or tantalum on the spacers;

forming a substantially conformal portion comprising a first conductor, the first conductor forming simultaneously within the at least one first opening and within the at least one second opening in the semiconductor wafer and substantially fills the at least one first opening and only partially fills the at least one second opening, wherein during the formation of the substantially conformal portion comprising the first conductor the electromigration barrier is in contact with the first conductor; and forming a second conductor which is different from the first conductor within the at least one second opening.

8. A method for use in fabrication of a semiconductor device, the method comprising:

etching a major surface of a semiconductor wafer to form at least one first opening and at least one second opening at least partially therethrough, wherein the at least one first opening has a narrower width than the at least one second opening;

forming a substantially conformal portion comprising a first conductor, the first conductor forming simultaneously within the at least one first opening and within the at least one second opening in the semiconductor wafer and substantially fills the at least one first opening and only partially fills the at least one second opening;

etching the first conductor within the at least one second opening in the semiconductor wafer while simultaneously etching the first conductor overlying the at least one first opening to remove the first conductor from the at least one second opening in the semiconductor wafer and leaving the first conductor within the at least one first opening in the semiconductor wafer; and forming a second conductor which is different from the first conductor within the at least one second opening.

9. A method for use in fabrication of a semiconductor device, the method comprising:

etching a major surface of a semiconductor wafer to form at least one first opening and at least one second opening at least partially therethrough, wherein the at least one first opening has a narrower width than the at least one second opening;

forming a substantially conformal portion comprising a first conductor, the first conductor forming simultaneously within the at least one first opening and within the at least one second opening in the semiconductor wafer and substantially fills the at least one first opening and only partially fills the at least one second opening, wherein the formation of the substantially conformal portion comprising the first conductor comprises:

forming a first copper portion using a physical vapor deposition process;

forming a second copper portion on the first copper layer using an electroless copper plating process;

forming a third copper portion on the second copper portion using an electrochemical deposition process; and forming a nickel portion on the third copper portion using an electrochemical deposition process; and forming a second conductor which is different from the first conductor within the at least one second opening.

10. A method of creating a semiconductor device on a semiconductor wafer, the method comprising:

creating at least one first opening and at least one second opening therein, the at least one first opening having a width that is narrower than a width of the at least one second opening;

forming a dielectric portion within the at least one first opening and within the at least one second opening;

forming a first conductive portion over the semiconductor wafer, the first conductive portion partially filling the at least one second opening and completely filling the at least one first opening;

forming, prior to forming the first conductive portion, a barrier portion on the dielectric portion; and subsequent to forming the first conductive portion filling the at least one second opening with solder.

* * * * *

UNITED STATES PATENT AND TRADEMARK OFFICE
CERTIFICATE OF CORRECTION

PATENT NO. : 7,648,900 B2 Page 1 of 1
APPLICATION NO. : 12/019920
DATED : January 19, 2010
INVENTOR(S) : Kyle K. Kirby et al.

It is certified that error appears in the above-identified patent and that said Letters Patent is hereby corrected as shown below:

In column 9, line 48, in Claim 6, delete "format" and insert -- form at --, therefor.

Signed and Sealed this

Twenty-third Day of March, 2010

David J. Kappos
*Director of the United States Patent and Trademark Office*